United States Patent
Moreira et al.

(10) Patent No.: US 8,264,236 B2
(45) Date of Patent: Sep. 11, 2012

(54) SYSTEM AND METHOD FOR ELECTRONIC TESTING OF DEVICES

(75) Inventors: Jose Moreira, Stuttgart (DE); Markus Rottacker, Stuttgart (DE)

(73) Assignee: Advantest (Singapore) Pte Ltd, Singapore (SG)

( * ) Notice: Subject to any disclaimer, the term of this patent is extended or adjusted under 35 U.S.C. 154(b) by 1230 days.

(21) Appl. No.: 11/998,024

(22) Filed: Nov. 28, 2007

(65) Prior Publication Data

US 2009/0138760 A1 May 28, 2009

(51) Int. Cl.
*G01R 31/08* (2006.01)
*G01R 31/00* (2006.01)
(52) U.S. Cl. ........................ 324/527; 324/500
(58) Field of Classification Search ............ 324/500, 324/527, 537, 555, 76.11, 76.28, 76.29, 76.31, 324/76.44, 750.28, 762.01; 714/25, 32
See application file for complete search history.

(56) References Cited

U.S. PATENT DOCUMENTS

| | | | |
|---|---|---|---|
| 6,269,202 B1 * | 7/2001 | Lee et al. | 385/24 |
| 6,411,746 B1 * | 6/2002 | Chamberlain et al. | 385/2 |
| 7,808,291 B2 * | 10/2010 | Nakamura et al. | 327/246 |
| 2004/0255673 A1 * | 12/2004 | Hattori | 73/514.16 |
| 2007/0061658 A1 * | 3/2007 | Hsu et al. | 714/742 |

FOREIGN PATENT DOCUMENTS

WO   WO 2006129491 A1 *  12/2006

* cited by examiner

*Primary Examiner* — Hoai-An D Nguyen
(74) *Attorney, Agent, or Firm* — Holland & Hart LLP

(57) ABSTRACT

A method for testing electronic devices involves receiving a stimulus signal for testing a device; changing an operating temperature of at least a component of an electrical filter while maintaining settings of the electrical filter, thereby altering the stimulus signal as the stimulus signal passes through the electrical filter, to create an altered stimulus signal; and outputting the altered stimulus signal.

21 Claims, 5 Drawing Sheets

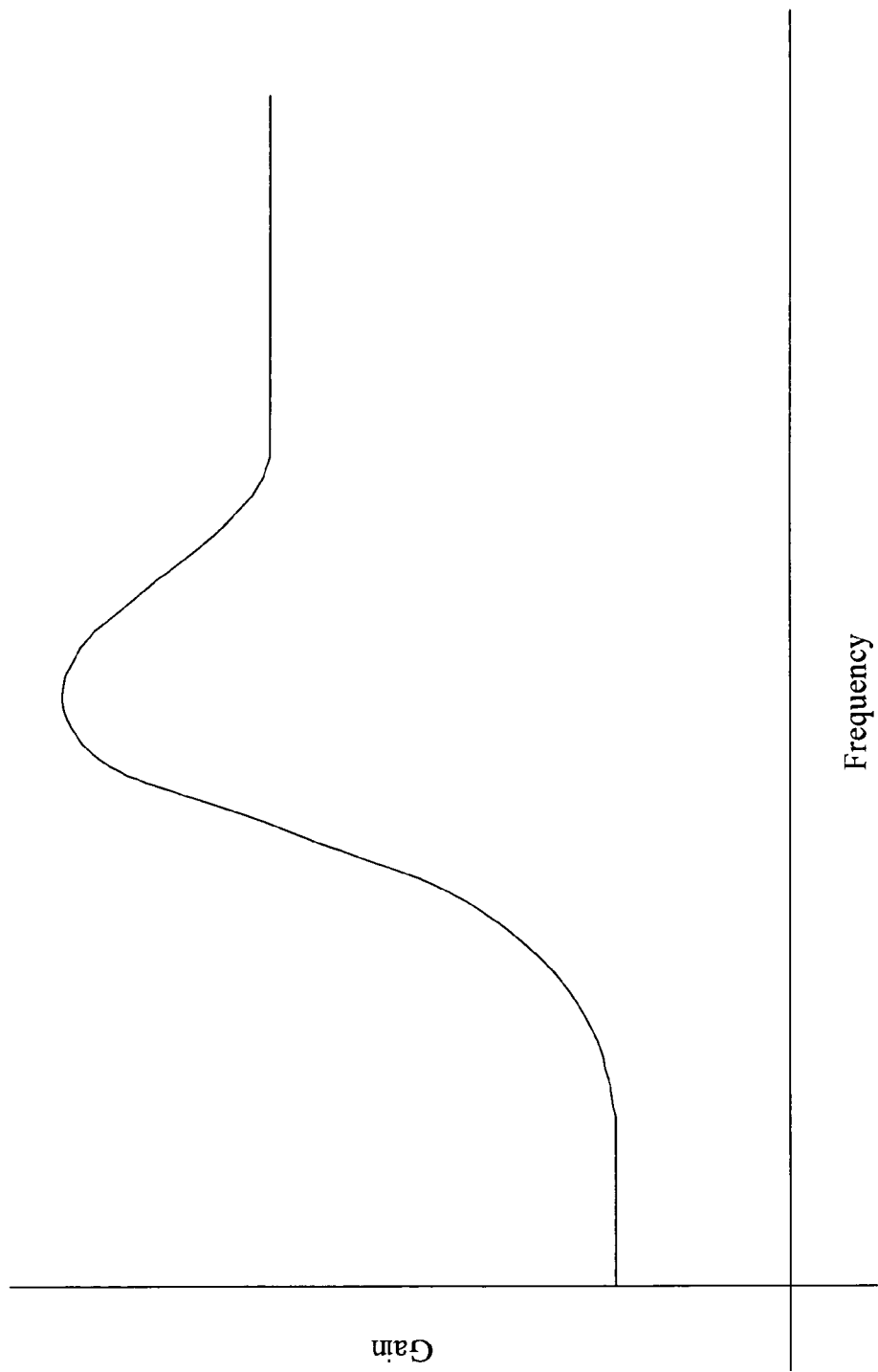

SYSTEM AND METHOD FOR ELECTRONIC TESTING OF DEVICES

BACKGROUND

A newly manufactured electronic device is tested by providing stimulus signals to the device and capturing its response. These measurements may be used to, for example, measure actual performance against expected performance. The electronic device may receive the stimulus signal to trigger the device under test (DUT). For example, the stimulus signal may include data that when received by the DUT, initiates a sequence of actions to be performed. The stimulus signal may be generated from a stimulus source that is electrically connected to a pin of a device through a printed circuit board known as text fixture or loadboard.

When testing a newly manufactured electronic device, the stimulus signal may experience loss of strength as it is transmitted through intermediate components from the testing apparatus to the DUT, e.g., wiring, an interface printed circuit board (PCB), etc. This loss often adds jitter to the stimulus signal. When the electronic device is tested, there are testing scenarios when an absence of jitter is preferred such as an ideal stimulus signal being used to measure the device operating at capacity. However, in other scenarios, the use of jitter is important to allow the testing to simulate actual scenarios. In a conventional method, a passive filter is used to equalize the loss or jitter that is created or to add a jitter to the stimulus signal. However, the passive nature of the filter restricts the testing to a specific set of conditions.

SUMMARY OF THE INVENTION

The present invention relates to a method for electronic testing of devices. The method comprises receiving a stimulus signal for testing a device. The method comprises setting a filter by changing a performance characteristic of the filter while maintaining settings of the filter, thereby altering the stimulus signal to create an altered stimulus signal. The method comprises outputting the altered stimulus signal.

DESCRIPTION OF THE DRAWINGS

FIG. 3a shows an exemplary loss compensation graph.

DETAILED DESCRIPTION

Figure 1:
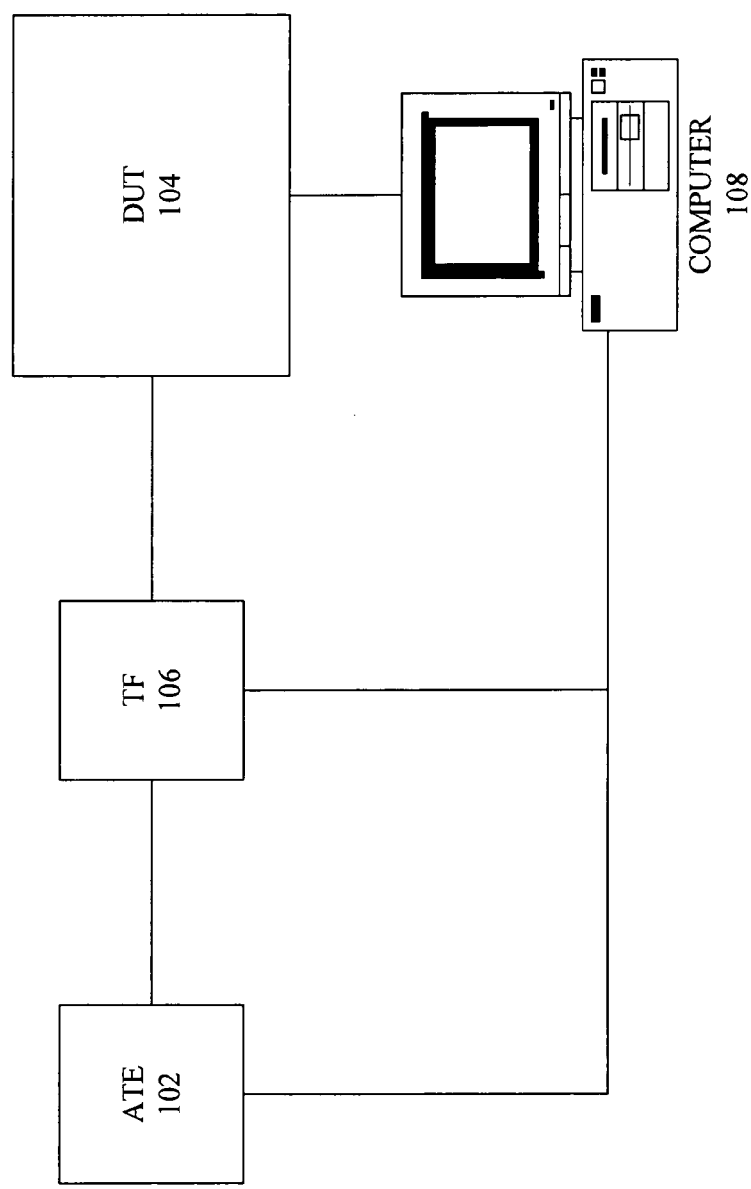
FIG. 1 shows an exemplary embodiment of a system according to the present invention.

The present invention may be further understood with reference to the following description and the appended drawings, wherein like elements are referred to with the same reference numerals. The exemplary embodiments of the present invention provide a system and method for performing an electronic test on an electronic device. The exemplary embodiments of the present invention will be described with reference to the electronic test utilizing a buffer to control the stimulus signal. The buffer and control will be described in detail below. The following exemplary embodiments describe a testing device that measures a single electronic device. However, those skilled in the art will understand that the present invention may also apply to testing devices that are capable of measuring multiple electronic devices concurrently.

When the electronic device is used in actual scenarios, the device is likely to experience jitter being added to its receiver or transmitted signals timing and levels through various causes such as non ideal reference clock to the device under test, temperature variations, lossy signal paths for the signals, crosstalk from adjacent signals, etc. These causes may even occur in a testing environment because all signals experience a measure of loss as they are transmitted from the measurement equipment to the device under test. Since mechanical reasons dictate that there is always some distance between the measurement equipment and the device under test it is unlikely that the electronic device continuously functions in an environment that allows ideal performance. Thus, to simulate an ideal signal for testing purposes, an equalization approach is necessary to compensate for the loss in the signal.

Jitter is also an important aspect to testing an electronic device. Jitter is an abrupt and unwanted variation of one or more signal characteristics such as the timing interval between successive pulses, the amplitude of successive pulses, the frequency or phase of successive pulses, etc. Thus, simulating jitter in a testing environment is an integral part of the design of any electronic device. By simulating as many possible scenarios in a testing phase of an electronic device, performance measurements may assist in designing the electronic device. By thoroughly testing an electronic device through various jitter conditions, the capabilities of the electronic device may be fully understood, thereby determining if the electronic device operates in compliance with a standard and/or a manufacturer specification. On the other side, when performing a jitter measurement, it is important that no unwanted jitter is added to the signal being measured by external factors like the test fixture. Due to jitter being caused naturally through, for example, the resistive properties of the connection devices, an accurate measure of jitter may be impeded. Thus, to simulate a predetermined jitter strength, the loss in the signal requires amplification to reach the predetermined strength.

FIG. 1 shows an exemplary embodiment of a system 100 according to the present invention. The system 100 may be for performing a test on an electronic device. The test may be for various types of electronic devices and may, therefore, include the various tests performed for the different types of electronic device. For example, with memory devices, a transmit/receive signal may be used to determine if the memory device performs in compliance with at least one of the performance metrics defined in, for example, the PCI-Express specification, the IEEE standard, etc. The exemplary embodiments of the present invention incorporate the various tests for the various types of electronic devices.

The system 100 includes an automatic test equipment (ATE) device 102 which is electrically coupled to a tunable filter (TF) 106. The TF 106 is electrically coupled to a device under test (DUT) 104. The system 100 may further include a computer 108 (e.g., PC, laptop, tablet, etc.) which may be coupled to the DUT 104, the TF 106, and/or the ATE device 102. The computer 108 (or any of the DUT 104, the TF 106, and/or the ATE device 102) may include a memory storing a set of instructions for implementing the electronic test. The computer 108 may include an output device, e.g., display screen, printer, etc., for outputting results of the electronic test. It should be noted that the use of a single ATE device 102 is only exemplary. Those skilled in the art will understand that multiple ATE devices may be electrically coupled directly to the DUT 104 or indirectly through the coupler 108. These other ATE devices may further be connected to the computer 108. For example, with frequency offset tests, one ATE device may include transmit and receive lines for data transmission/reception. Another ATE device may include a clock to time the different data transfers.

In the exemplary embodiment, the DUT 104 may be any electronic device (e.g., microprocessor, graphics processor, high speed memory device, etc.). In most cases, the DUT 104 purports to operate in accordance with a specification such as the PCI-Express specification, Hypertransport consortium, IEEE specification, etc. and the testing may be based on the specifications. The DUT 104 may implement, for example, a System-on-a-Chip (SoC) or a System-in-a-Package (SIP) architecture. The ATE device 102 may be SoCs which include a microprocessor, memory and a plurality of application specific integrated circuits (ASICs) implementing a test-per-pin architecture in which each pin of the DUT 102 may be tested independently. For example, the ATE device 102 may be for digitally testing channels. The ATE device 102 measures parametric performance measurements pertaining to the DUT 104. This data may be transmitted to the computer 108 for storage and/or processing.

Figure 2:
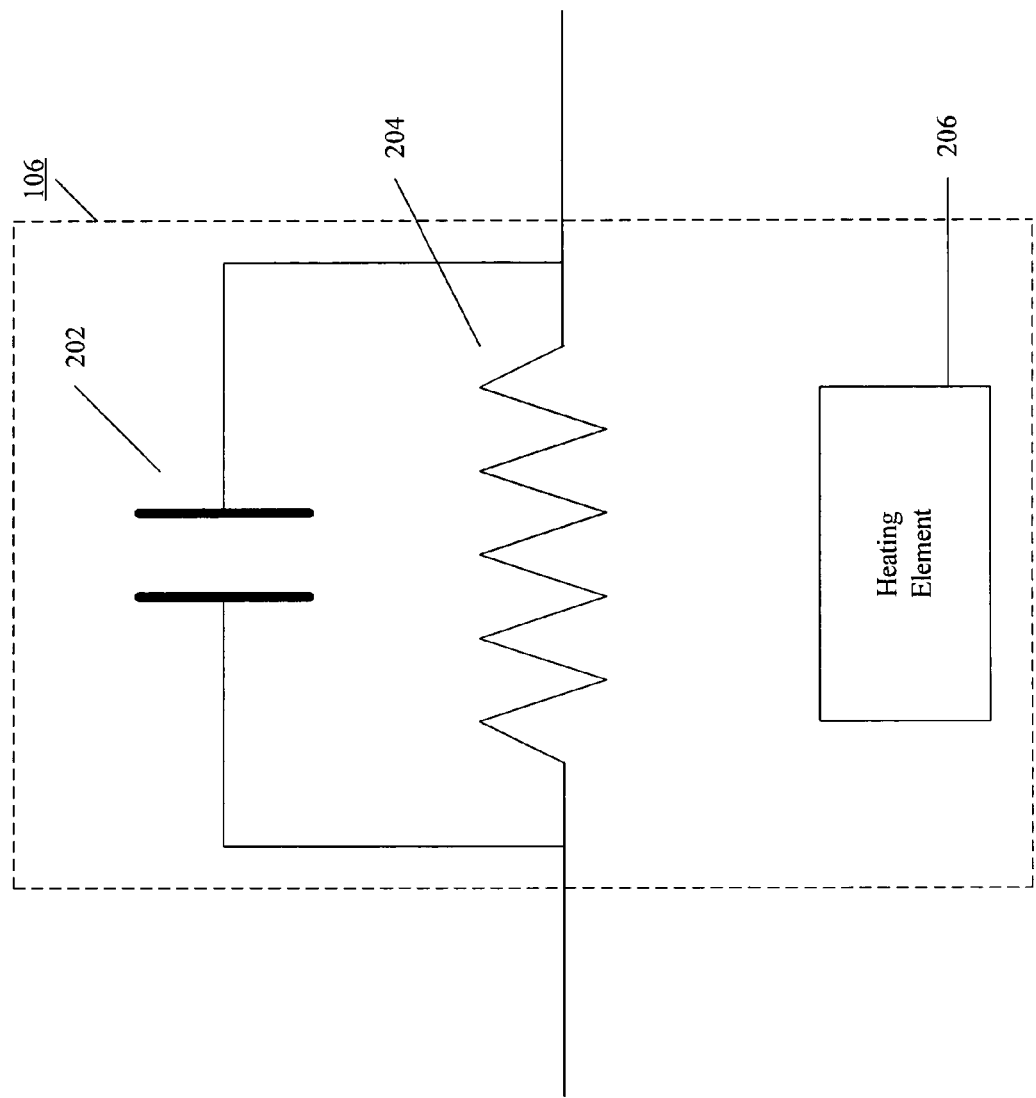
FIG. 2 shows an exemplary schematic of a buffer according to the present invention.

The TF 106 will be described with reference to FIG. 2. FIG. 2 shows an exemplary schematic of the TF 106 of the system 100 of FIG. 1. In the exemplary embodiment, the TF 106 may include a resistor-capacitor (RC) filter. Thus, the TF 106 may include a capacitor 202 and a resistor 204. The capacitor 202 and the resistor 204 may have settings pertaining to the respective component. For example, a manufacturer setting for the RC filter may be the capacitor 202 with a preset farad and the resistor with a preset ohm. In one exemplary embodiment, these manufacturer settings may be kept constant. However, in another exemplary embodiment, the manufacturer settings may be altered to adjust to the proper signal for testing. The TF 106 may further include a heating element 206. The heating element 206 may provide or remove heat in accordance to the exemplary embodiment of the present invention. Those skilled in the art will understand that, in addition to the settings, the performance of the capacitor 202 and the resistor 204 may be dependent on temperature (i.e., performance characteristic). Thus, by controlling the heating element 206, various testing conditions may be simulated such as compensating for loss of a signal or increasing jitter on a signal. That is, the performance characteristic of the TF 106 may be properly altered to correspond to the test to be performed on the DUT 104. The use of the TF 106 in relation to controlling the testing conditions will be discussed in detail below with reference to FIG. 4.

As described above, there may be other intermediate components between the ATE 102 and the DUT 104. For example, a PCB may be used to interface the ATE 102 to the DUT 104. The PCB (or other intermediate component) may introduce the above described loss. The TF 106 may be located after these intermediate components to compensate for the loss. In one exemplary embodiment, the TF 106 may be implemented as a component on the PCB. In another exemplary embodiment, the TF 106 may be implemented as a separate component.

The use of a single heating element 206 is only exemplary. The TF 106 may include multiple heating elements for each of the components housed therein (e.g., a heating element for the resistor 204 and a separate heating element for the capacitor 202). It should also be noted that the TF 106 may be controlled through a variety of means. For example, the TF 106 may include a control input from the computer 108 and/or the ATE 102. That is, the ATE 102 or the computer 108 may desire to set the heating element 206 of the TF 106 at a certain level. The ATE 102 or the computer 108 may output a control signal indicating that the heating element 206 should be set at the level. The level and the purpose of setting the level will be described in greater detail below. The TF 106 will receive the control signal and provide the heating element 206 with the requisite amount of power to achieve the desired heating level. It should be noted that other device or the TF 106 itself may also generate the control signal to control the heating level.

Those skilled in the art will understand that the power for the heating element 206 may be the control signal itself or may be from a separate power source. In the exemplary embodiment of the TF 106 being a component on the PCB, the heating element 206 may receive power from a power supply or source through the PCB. In another exemplary embodiment, the TF 106 may have a feedback mechanism such as a temperature detector (e.g., thermocoupler, RTD, etc.) that may indicate the temperature in the TF 106 so that the controlling device (e.g., ATE 102, computer 108) may vary the control signal as needed.

Figure 4:
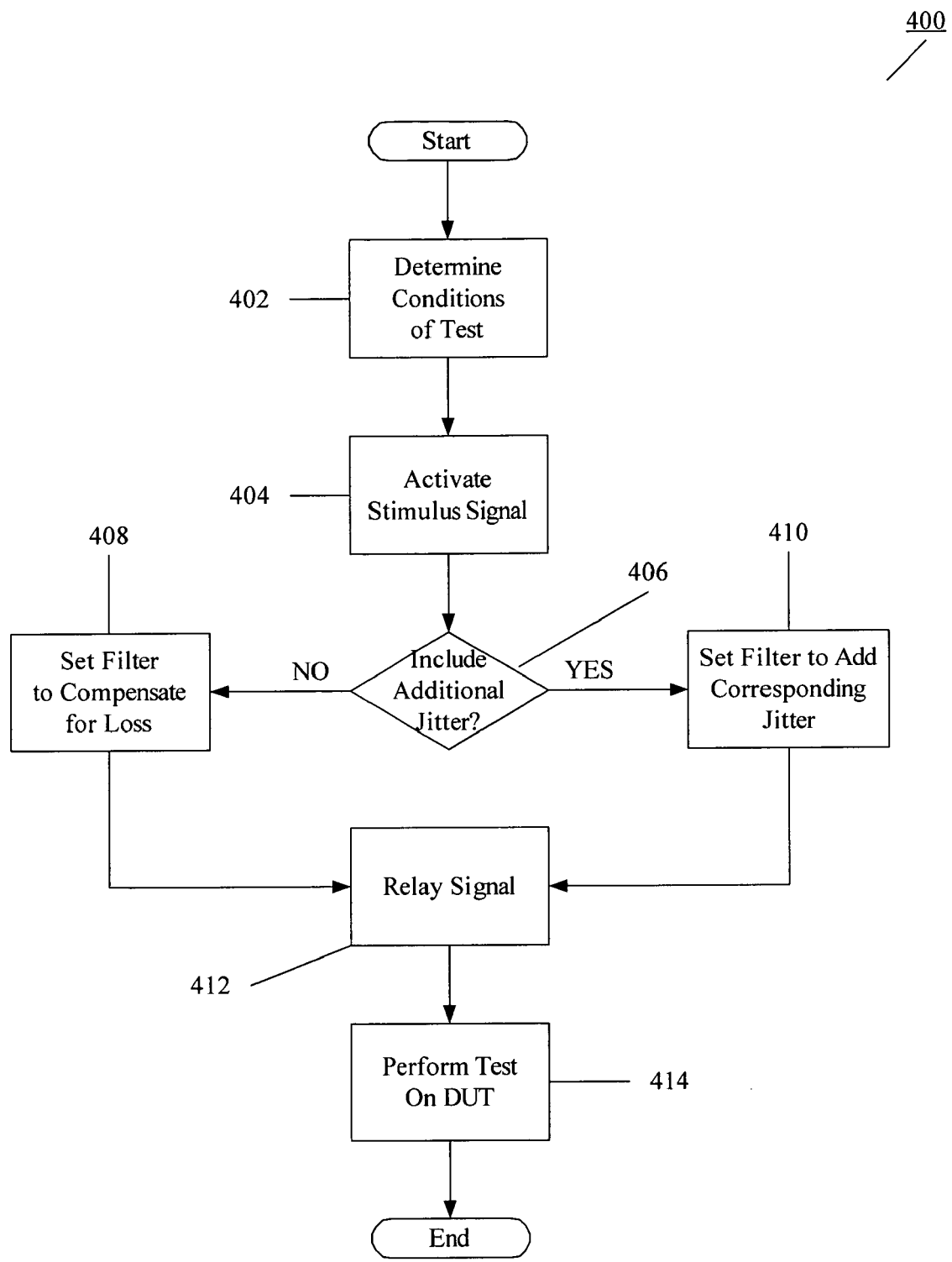
FIG. 4 shows an exemplary embodiment of a method according to the present invention.

FIG. 4 shows an exemplary embodiment of a method 400 according to the present invention. The method 400 describes a test for an electronic device that utilizes a tunable filter to adjust the stimulus signal according to predetermined conditions. The tunable filter provides a cost efficient (e.g., various stimulus signals with a common set of components) method to test an electronic device with an ideal signal and/or various degrees of jitter. The method 400 will be described with reference to the system 100 of FIG. 1 and the TF 106 of FIG. 2.

In step 402, conditions of the test to be performed on the DUT 104 is determined. As discussed above, the test may require a "pure" signal (i.e., ideal or unjittered) with no loss or a jittered signal with a specific loss. Therefore, prior to transmitting the signal to the DUT 104, the appropriate measurements are calculated to create the corresponding signal.

In step 404, a stimulus signal is activated. The stimulus signal may originate from the ATE device 102. In addition, the stimulus signal is used to test the DUT 104 by activating a functionality (e.g., input a type of data related to the functionality) the DUT 104 purports to be able to execute in compliance with, for example, a standard and/or a manufacturer specification.

In step 406, a determination is made whether to include an additional jitter into the stimulus signal. As discussed above, the stimulus signal experiences loss while being transmitted from the ATE 102 to the DUT 104. Thus, to create the specific loss in the signal requires adding a difference in the amount of specific loss and the naturally occurring loss.

If it is determined in step 406 that the stimulus signal is not to include additional jitter, in step 408, the TF 106 is set to compensate for any loss experienced by the stimulus signal while being transmitted. This scenario may arise, for example, when the test is to be conducted for the "pure" signal or a signal with less jitter than would occur based on the loss experienced while conducted through the circuit. That is, with a "pure" signal, the loss that is experienced is compensated by returning the stimulus signal to the conditions at the time the signal is transmitted from the ATE 102. With a signal with less jitter that would occur based on the loss in the circuit, the loss that is experienced requires some correction to reach the target jitter strength.

The TF 106 may accomplish this compensation in a variety of manners. According to one exemplary embodiment of the present invention, temperature is used to compensate for the experienced loss. Those skilled in the art will understand that temperature has an effect on the capabilities of a resistor and capacitor. Thus, increasing or decreasing the temperature at which the resistor and capacitor operate alters the properties of the signal that is transmitted therethrough.

To compensate for loss in the signal, the heating element 206 may increase the temperature at which the TF 106 operates. The heating element 206 providing additional heat to the resistor 204 and/or the capacitor 202 may decrease the loss of the signal so that a target jitter is reached (e.g., less jitter than experienced on transmission) or the jitter that occurs is compensated (e.g., no jitter in the signal).

Those skilled in the art will understand that the capacitor 202 of the TF 106 may be controlled by temperature. That is, the magnitude of leakage current for the capacitor 202 may be controlled by the temperature, the type of dielectric, the capacitance rating, and/or the time of electrification prior to making the measurement. In particular with temperature, the insulation resistance properties of the capacitor 202 decreases with increased temperature. The increase in temperature causes an increase in the orbital velocity of the electrons therein, resulting in a higher flow of electrons through the capacitor 202. Those skilled in the art will also understand that the resistor 204 of the TF 106 may be controlled by temperature. That is, the electrical resistance of a conductor may be dependent upon collisional processes within the resistor 204. Therefore, the resistor 204 may be expected to increase its resistance with an increase in temperature since more collisions occur. Conversely, a decrease in temperature of either the capacitor 202 and/or the resistor 204 creates an opposite effect.

The use of the TF 106 and its constituent parts (e.g., capacitor 202, resistor 204) may provide the necessary control to alter the stimulus signal from the ATE 104 appropriately. That is, through a common increase in temperature to both the capacitor 202 and the resistor 204, the necessary compensation may be reached to create the proper signal. In another embodiment of the present invention, the heating element 206 may independently control the temperatures of the resistor 204 and the capacitor 202. For example, increasing the temperature of the capacitor 202 and decreasing the temperature of the resistor 204 may create a signal that may further compensate for any loss of the signal. This situation may arise when, for example, the DUT 104 is used with an amplifier disposed between the ATE 102 and the DUT 104. Therefore, to simulate this scenario, the independent control may be used.

FIG. 3a shows an exemplary loss compensation graph. The loss compensation graph illustrates an exemplary behavior for an RC circuit. For example, when the capacitor has a temperature of 40° C. and the resistor has a temperature of 30° C., a gain profile that is frequency dependent may be reached. In this case, the profile is intended to compensate the loss profile of a PCB test fixture that connects the ATE to the DUT. Other gain/frequency profiles might be reached depending on the specific profile of the DUT to ATE connection. It should be noted that each RC circuit is individual and may therefore be tuned based on the individual RC circuit response. That is, each TF 106 may have a specific gain response based on temperature (or other compensation factor). This response or performance may be programmed into the device generating the control signal for the TF 106. In addition, a calibration procedure may be performed prior to use of a TF 106 in order to establish the response of the individual TF 106.

If it is determined in step 406 that the stimulus signal is to include additional jitter, in step 410, the TF 106 is set to add a corresponding jitter to the loss expected to be experienced by the stimulus signal while being transmitted. As discussed above, testing the DUT 104 in various jitter strengths allows a thorough comprehension of the capabilities of the DUT 104. With a signal with more jitter than that naturally occurring, the loss that is experienced requires augmentation to reach the target jitter strength.

The TF 106 may also accomplish this augmentation in a variety of manners. According to one exemplary embodiment of the present invention, temperature is used to augment the experienced loss. As discussed above, those skilled in the art will understand that temperature has an effect on the capabilities of a resistor and capacitor. Accordingly, the decrease in temperature at which the resistor and capacitor operate provides the necessary augmentation to the signal.

To augment the loss in the signal, the heating element 206 may alter the temperature at which the TF 106 operates. The heating element 206 changes the heating to the resistor 204 and/or the capacitor 202 may increase the loss of the signal so that a target jitter is reached (e.g., more jitter than experienced on transmission). As discussed above, the change in temperature affects the capacitor 202 and/or the resistor 204 accordingly.

Figure 3B:
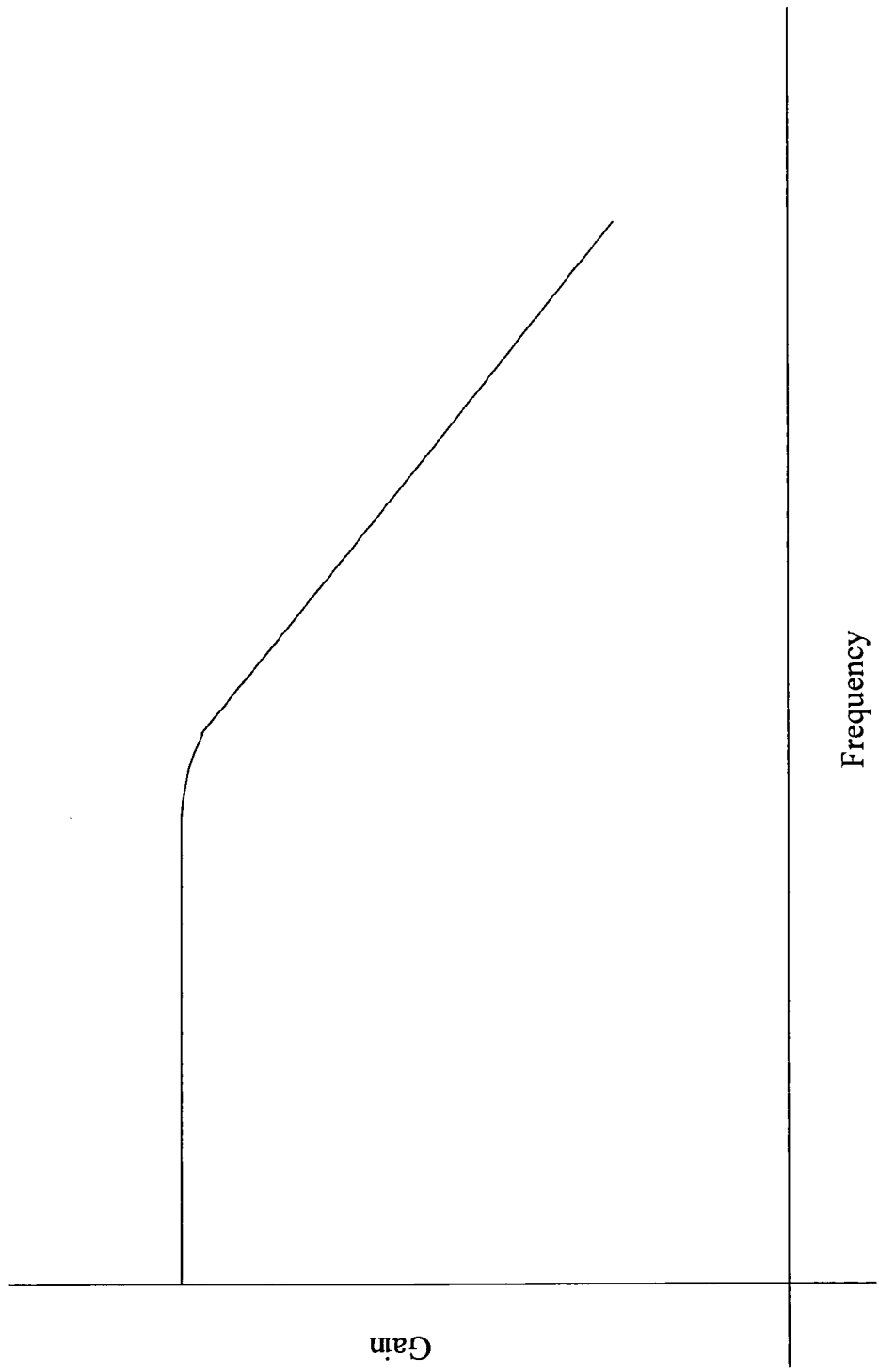
FIG. 3b shows an exemplary jitter injection graph.

FIG. 3b shows an exemplary gain versus frequency graph of a filter that result in jitter being injected on the signal going through the filter. The jitter injection graph illustrates an exemplary behavior for an RC circuit. For example, when the capacitor has a temperature of 20° C. and the resistor has a temperature of 10° C., a specific gain versus frequency profile is generated. In this case, the profile has a low pass type filter behavior will reduce the bandwidth of the signal and in this way, inject jitter on the signal through a process known as inter-symbol interference in the case of a random data signal. Other profiles may also be reached depending on the parameters of the test (e.g., no jitter, slight jitter, etc.). It should again be noted that each RC circuit is individual and may therefore be tuned based on the individual RC circuit response.

In step 412, the signal is relayed. As shown in the exemplary embodiment of system 100 of FIG. 1, the signal is relayed from the ATE 102 to the TF 106 to the DUT 104. Thus, the signal may be altered according to the test conditions determined in step 402. Once the signal is appropriately altered (e.g., steps 206-410, the signal is prepared for relay so that the test may be performed in step 414.

It should be noted that the method 400 may include additional steps. For example, the method 400 may be designed to compare the results of the test to a standard and/or a manufacturer specification. Thus, the method 400 may include a step where the standard and/or the manufacturer specification is loaded. Upon performing the test at step 414, an alert may be displayed on the output device of the computer 108 indicating whether the DUT 104 passed or failed the electronic test.

It should also be noted that the stimulus signal being activated prior to altering the signal is only exemplary. The method 400 may activate the stimulus signal after setting the filter (e.g., step 408 or step 410). Thus, after determining the conditions of the test in step 402, the method 400 may set the TF 106 according to the conditions. The stimulus signal may then be activated to be relayed.

Those skilled in the art will understand that the present invention may be applied to components of electronic devices as well. That is, the use of a finalized electronic device (i.e., complete manufacture) is only exemplary. For example, a finalized component of the electronic device may be the "DUT" where various constituent parts are the "components." Thus, applying the system and method described above, the configuration of components may also be tested.

Those skilled in the art will also understand that the above described exemplary embodiments may be implemented in any number of manners, including, as a separate software module, as a combination of hardware and software, etc. For example, the method 200 may be a program containing lines of code that, when compiled, may be executed on a processor of the computer 108.

The present invention allows the DUT 104 to be tested using a variety of stimulus signals from an ideal signal with no jitter to a signal experiencing a predetermined loss. Furthermore, the present invention also allows jitter to be controlled according to the tester's needs. Thus, the present invention provides a cost efficient system and method for testing an electronic device in various jitter conditions. The manufacturer may select a specific strength of jitter to be included in the stimulus signal. Therefore, the present invention eliminates the need for using various passive buffers that require swapping to attain testing conditions and allows for the variety of jitter strengths that are possible with the various passive buffers.

In one exemplary embodiment, the TF 106 is disposed on a printed circuit board (PCB) that is used to connect the ATE 102 to the DUT 104. In such an embodiment, the ability to test the DUT 104 using the compensation signal is accomplished without altering the ATE 102 or the DUT 104 in any manner. Thus, an ATE 102 that does not include the ability to test using a compensation signal may be used to perform tests that require jitter or compensate for jitter without any modification to the ATE 102.

It will be apparent to those skilled in the art that various modifications may be made in the present invention, without departing from the spirit or scope of the invention. Thus, it is intended that the present invention cover the modifications and variations of this invention provided they come within the scope of the appended claims and their equivalents.

What is claimed is:

1. A method, comprising:
   receiving at an electrical filter a stimulus signal for testing a device;
   changing an operating temperature of at least a component of the electrical filter while maintaining settings of the electrical filter, thereby altering the stimulus signal as the stimulus signal passes through the electrical filter, to create an altered stimulus signal; and
   outputting the altered stimulus signal.

2. The method of claim 1, wherein changing the operating temperature of at least the component of the electrical filter causes the electrical filter to perform at least one of the actions selected from the group consisting of: compensating for jitter occurring in the stimulus signal, augmenting the jitter occurring in the stimulus signal, and maintaining the jitter occurring in the stimulus signal.

3. The method of claim 2, wherein the altered stimulus signal has a jitter corresponding to one of: less than the jitter occurring in the stimulus signal, greater than the jitter occurring in the stimulus signal, and equal to the jitter occurring in the stimulus signal.

4. The method of claim 1, wherein the operating temperature of at least the component of the electrical filter is changed by increasing an operating temperature of the electrical filter.

5. The method of claim 1, wherein the operating temperature of at least the component of the electrical filter is changed by decreasing an operating temperature of the electrical filter.

6. The method of claim 1, wherein the electrical filter comprises a resistor-capacitor (RC) circuit.

7. The method of claim 6, wherein the electrical filter includes a heating element to change the operating temperature of the RC circuit.

8. The method of claim 2, further comprising:
   determining a difference between the jitter occurring in the stimulus signal and a desired jitter; and
   changing the operating temperature of at least the component of the electrical filter to compensate for the difference.

9. The method of claim 1, wherein the stimulus signal is received from automatic test equipment.

10. The method of claim 9, wherein the electrical filter is disposed as one of a separate unit and a portion of a printed circuit board interposed between the automatic test equipment and the device.

11. An electrical filter, comprising:
    an input port receiving a stimulus signal for testing a device;
    an alteration device for changing an operating temperature of at least a component of the electrical filter while maintaining settings of the electrical filter, the electrical filter altering the stimulus signal based on the operating temperature of at least the component, and the settings, to create an altered stimulus signal; and
    an output port outputting the altered stimulus signal to the device.

12. The electrical filter of claim 11, wherein the the electrical filter is configured, in response to the operating temperature of at least the component of the electrical filter to perform at least one of the actions selected from the group consisting of: compensating for jitter occurring in the stimulus signal, augmenting the jitter occurring in the stimulus signal, and maintaining the jitter occurring in the stimulus signal.

13. The electrical filter of claim 12, wherein the altered stimulus signal has a jitter corresponding to one of: less than the jitter occurring in the stimulus signal, greater than the jitter occurring in the stimulus signal, and equal to the jitter occurring in the stimulus signal.

14. The electrical filter of claim 11, wherein the alteration device changes the operating temperature of at least the component of the electrical filter by increasing an operating temperature of the electrical filter.

15. The electrical filter of claim 11, wherein the alteration device changes the operating temperature of at least the component of the electrical filter by decreasing an operating temperature of the electrical filter.

16. The electrical filter of claim 11, wherein the electrical filter comprises a resistor-capacitor (RC) circuit.

17. The electrical filter of claim 11, wherein the alteration device comprises a heating element.

18. The electrical filter of claim 12, further comprising:
    a determination device determining a difference between the jitter occurring in the stimulus signal and a desired jitter;
    wherein the alteration device changes the operating temperature of at least the component of the electrical filter to compensate for the difference.

19. The electrical filter of claim 11, wherein the stimulus signal is received from automatic test equipment.

20. The electrical filter of claim 19, wherein the electrical filter is disposed as one of a separate unit and a portion of a printed circuit board interposed between the automatic test equipment and the device.

21. A system, comprising:
    an automatic test equipment device generating a stimulus signal; and an electrical filter including an input port to receive the stimulus signal, an alteration device to change an operating temperature of at least a component of the electrical filter while maintaining settings of the electrical filter, the electrical filter altering the stimulus signal based on the operating temperature of at least the component, and the settings, to create an altered stimulus signal, and an output port to output the altered stimulus signal to test a device.

* * * * *